(12) United States Patent
Ono

(10) Patent No.: US 6,369,743 B2
(45) Date of Patent: Apr. 9, 2002

(54) DIFFERENTIAL AMPLIFIER, COMPARATOR, AND A/D CONVERTER

(75) Inventor: Koichi Ono, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/740,793

(22) Filed: Dec. 21, 2000

(30) Foreign Application Priority Data

Dec. 28, 1999 (JP) ............................................. 11-374228

(51) Int. Cl.⁷ ................................................ H03M 1/36
(52) U.S. Cl. ...................... 341/159; 341/118; 341/119; 341/120; 341/127; 341/136; 341/155; 341/156; 341/158; 341/160; 341/166
(58) Field of Search ................................ 341/127, 118, 341/119, 120, 136, 155, 156, 158, 166, 160, 159

(56) References Cited

U.S. PATENT DOCUMENTS

| | | | | |
|---|---|---|---|---|
| 4,590,459 A | * | 5/1986 | Lanz | 341/127 |
| 5,528,242 A | * | 6/1996 | Kuma et al. | 341/159 |
| 5,736,951 A | * | 4/1998 | Kobatake | 341/159 |
| 6,121,913 A | * | 9/2000 | Glass et al. | 341/159 |

OTHER PUBLICATIONS

Wakimoto, Tsutomu and Yukio Akazawa. A Low–Power Wide–Band Amplifier Using a New Paeasitic Capacitance Compensation Technique. IEEE Journal of Solid–State Circuits, vol. 25, No. 1, Feb. 1990.

* cited by examiner

Primary Examiner—Michael Tokar
Assistant Examiner—Lam T. Mai
(74) Attorney, Agent, or Firm—Rader, Fishman & Grauer PLLC; Ronald P. Kananen, Esq.

(57) ABSTRACT

An OTA circuit is disposed between a differential pair composed of NMOS transistors and an NMOS follower transistor that composes an output buffer circuit. The OTA circuit generates a compensation current that is equal to a current that flows in a capacitance formed between the gate and the drain of each of the differential pair transistors and that flows in the reverse direction thereof. The compensation current cancels the current that flows in the capacitance formed between the gate and the drain of each of the differential pair transistors. Thus, a differential amplifier that has a high accuracy and, high gain, and a wide frequency band and that operates at a low power voltage can be accomplished. Using a differential amplifier having a high gain and a wide frequency band, a comparator that operates at high speed and an A/D converter using such a comparator can be accomplished.

16 Claims, 13 Drawing Sheets

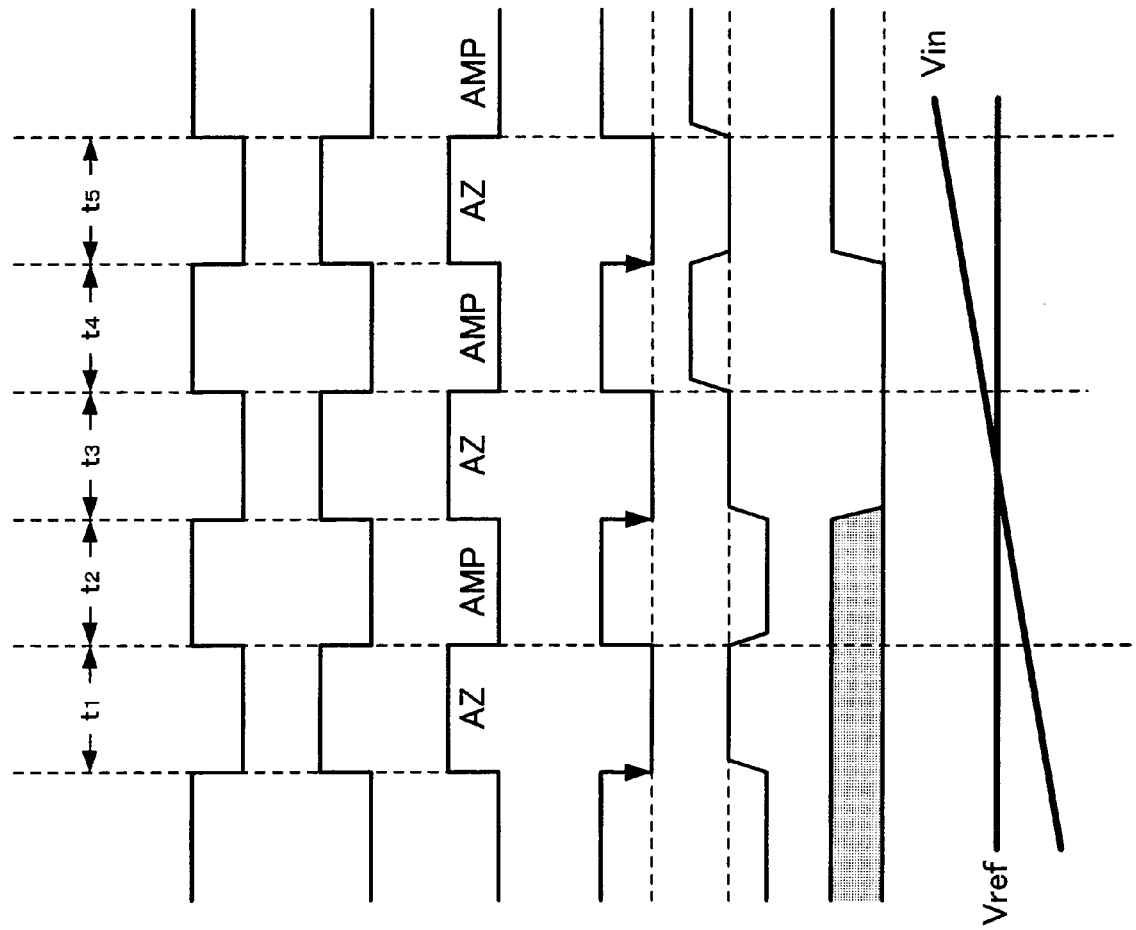

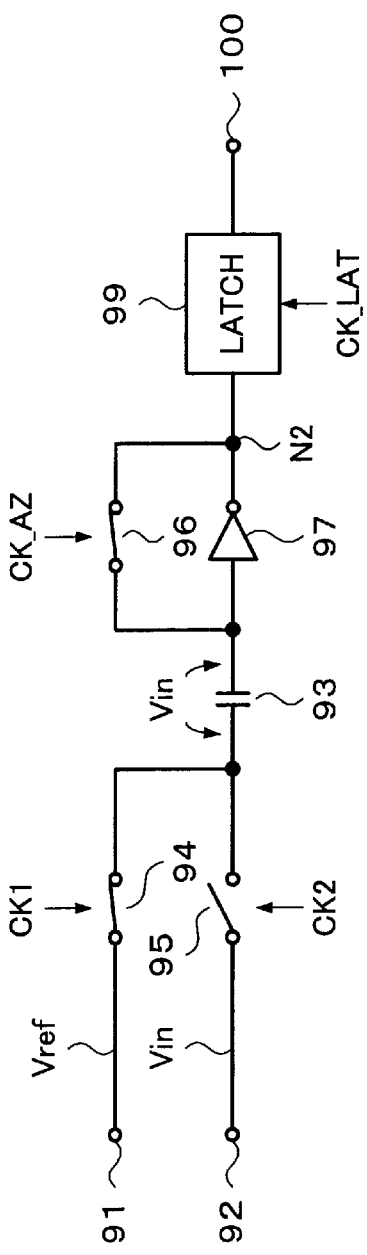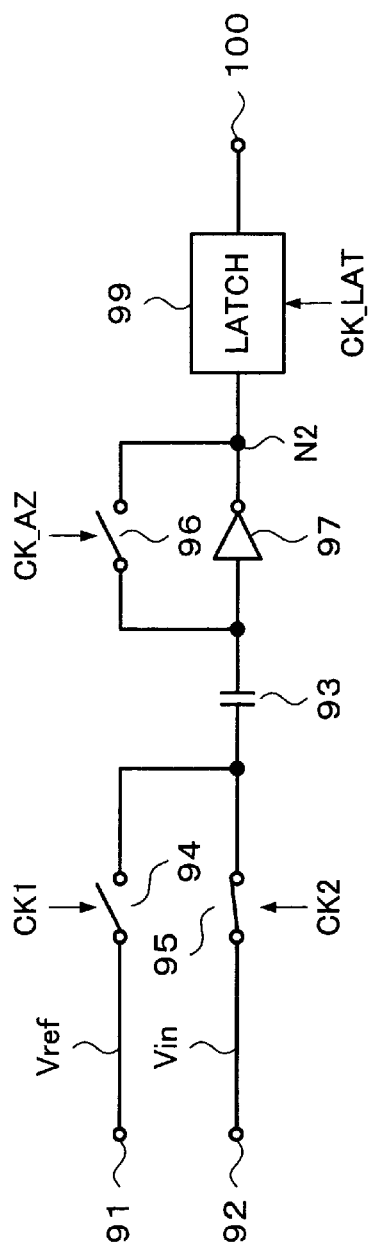
Fig. 12A
Fig. 12B

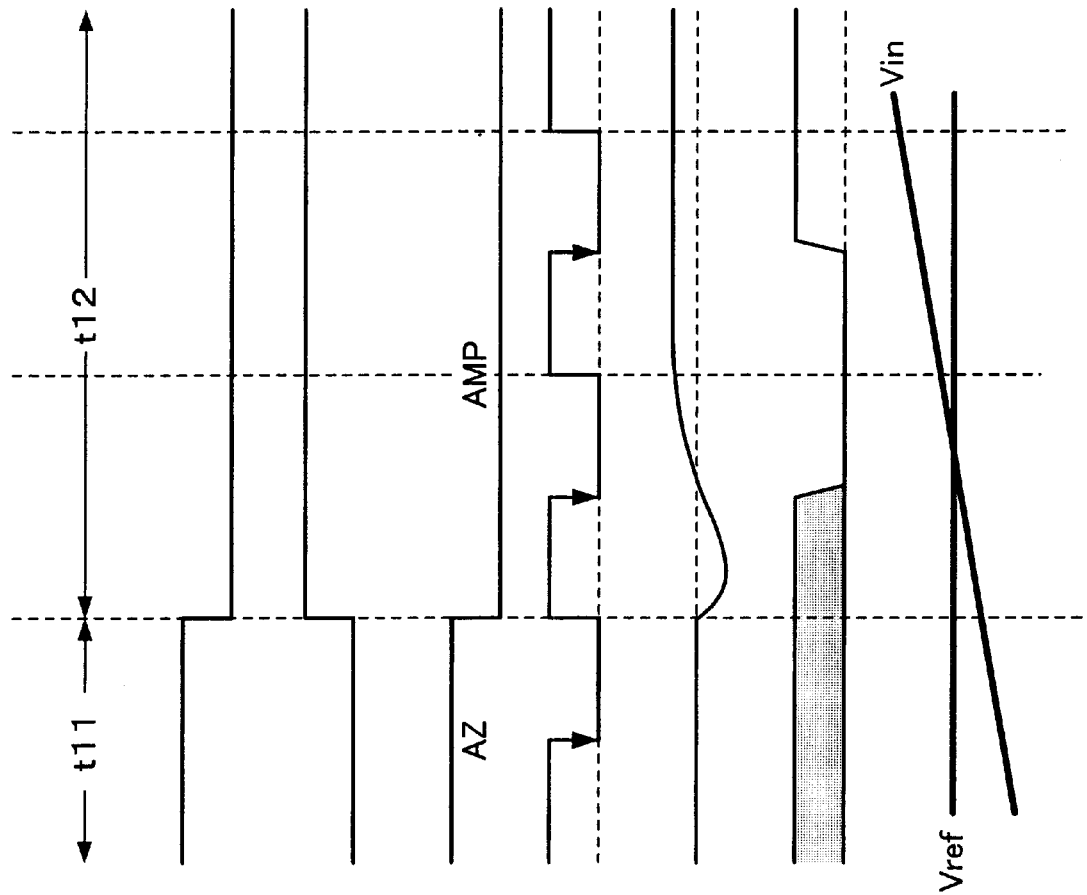

DIFFERENTIAL AMPLIFIER, COMPARATOR, AND A/D CONVERTER

BACKGROUND OF THE INVENTION

1. Field of the Invention

The present invention relates to an A/D converter that operates at high speed necessary for digitizing a reproduction signal of a hard disk, a comparator that accomplishes such an A/D converter, and a differential amplifier that accomplishes such a comparator.

2. Description of the Related Art

As the speed of a signal process increases, a high speed A/D converter is desired. For example, a hard disk drive has an A/D converter that digitizes a reproduction signal of a head is disposed so as to perform an equalizing process and a Viterbi decoding process. As the speed of a hard disk drive increases, an A/D converter having 6 to 8 quantizing bits having a sampling clock signal frequency of several 100 MHz (for example, 400 MHz) is desired.

An A/D converter compares an input voltage with a reference voltage and encodes the compared voltage so as to convert an analog signal into a digital signal. As was described above, to accomplish an A/D converter that operates at high speed, a comparator should be composed of a differential amplifier having a high gain and a wide frequency band.

Conventionally, an analog circuit that operates at high speed is composed of bipolar transistors. Thus, a differential amplifier having a high gain and a wide frequency band may be composed of bipolar transistors.

However, the power consumption of a bipolar transistor is large. In addition, a bipolar transistor cannot be integrated with another signal processing circuit as an integrated circuit. Thus, it is strongly desired to accomplish a differential amplifier having a high gain and a wide frequency band with CMOS transistors.

Parameters that allow a differential amplifier composed of CMOS transistors to have a high gain and a wide frequency band are the current and the size because gm (mutual conductance) of an MOS transistor depends on the current that flows therein and the size thereof. Thus, to accomplish a differential amplifier having a high gain, it is necessary to set a high current value or increase the size of each MOS transistor.

When the current that flows in a MOS transistor is increased, the power consumption is adversely increased. When the size of a MOS transistor is increased, the parasitic capacitance is increased. Thus, a wide frequency band cannot be accomplished.

In a differential circuit composed of bipolar transistors, a compensating circuit is disposed. The compensating circuit generates a compensation current that flows in the reverse direction of a current that flows in a capacitance $C_{BC}$ formed between the base and the collector of each bipolar transistor. The compensation current cancels a current that flows between the base and the collector of the bipolar transistor. As a result, the problem of the band limitation due to the parasitic capacitance can be solved. Thus, a differential amplifier having a wide frequency band is accomplished. Such a technique is proposed in "A Low-Power Wide-Band Amplifier Using a New Parasitic Capacitance Compensation Technique", IEEE Journal of Solid-State Circuit, Vol. 121, No. 1, February 1990.

When a differential amplifier having a high gain and a wide frequency band is accomplished using CMOS transistors, such a technique may be used. As was described above, when the size of each MOS transistor is increased, a high gain can be obtained. In that case, the parasitic capacitance is increased. When the technique for canceling the current that flows in the parasitic capacitance with the compensation current is applied to a CMOS structure, a CMOS differential amplifier having a high gain and a wide frequency band is accomplished. Thus, using such a differential amplifier, a high speed A/D converter can be accomplished.

As shown in FIG. 1, when an amplifier is considered as a model of which a network of a resistor R and a capacitor C is driven by a signal source $V_i$ having a signal source resistor $R_S$, the following formula can be obtained.

$$G_0 = \frac{R_s // R}{R_S} \tag{1}$$

$$f_{3dB} = \frac{1}{2piC(R // R_S)} \tag{2}$$

$$G_0 B = G_0 f_{3dB} = \frac{1}{2PiCR_S} \tag{3}$$

where $G_0$ is a DC gain; $f_{3\ dB}$ is a frequency band that lowers by 3 dB; pi is δ (ratio of circumference of circle to its diameter); and $G_0B$ is a gain bandwidth.

As expressed in Formula (3), the frequency band depends on the capacitance C and the resistance $R_S$ of the signal source. In the case of a bipolar transistor, the capacitance C that limits the frequency band is equivalent to the capacitance $C_{BC}$ formed between the base and the collector of the bipolar transistor. Since the capacitance $C_{BC}$ formed between the base and the collector of the bipolar transistor is amplified by the mirror effect. Thus, the capacitance $C_{BC}$ largely affects the decrease of the frequency band.

As shown in FIG. 2, to solve such a problem, a current source $sC_CV_O$ (where s: Laplace operator) that varies corresponding to the output voltage $V_O$ is disposed on the output side. The current $sC_CV_O$ cancels the current that flows in the capacitance C. In that case, the following formulas can be obtained.

$$G_0 = \frac{R_s // R}{R_S} \tag{4}$$

$$f_{3dB} = \frac{1}{2Pi(C - C_c)(R // R_s)} \tag{5}$$

$$G_0 B = G_0 f_{3dB} = \frac{1}{2Pi(C - C_c)R_s} \tag{6}$$

Assuming that C=Cs, the denominator becomes 0. Thus, it is clear that the frequency band is not limited.

FIG. 3 shows an example of the structure of a differential amplifier using bipolar transistors, each of which having a current that flows in a capacitance formed between the base and the collector that is canceled with a compensation current corresponding to an output voltage so as to widen the frequency band.

In FIG. 3, the emitters of NPN transistors 201 and 202 are connected. The emitters of the transistors 201 and 202 are connected to a ground line 204 through a current source 203. Input terminals 221 and 222 are connected to the bases of the transistors 201 and 202.

The collectors of the transistors 201 and 202 are connected to a power line 207 through resistors 205 and 206, respectively. In addition, the collectors of the transistors 201 and 202 are connected to the bases of transistors 208 and 209, respectively. The collectors of the transistors 208 and 209 are connected to the power line 207. The emitters of transistors 208 and 209 are connected to the ground line 204 through current sources 210 and 211, respectively. In addition, the emitters of the transistors 208 and 209 are connected to output terminals 223 and 224, respectively.

In addition, the emitters of the transistors 208 and 209 are connected to the bases of transistors 212 and 213, respectively. The collectors of the transistors 212 and 213 are connected to the collectors of the transistors 202 and 201, respectively. The emitters of the transistors 212 and 213 are connected to the ground line 204 through current sources 214 and 215, respectively. In addition, a capacitor 216 is connected between the emitter of the transistor 212 and the emitter of the transistor 213.

In FIG. 3, a difference input voltage that is input from the input terminals 221 and 222 is amplified by the transistors 201 and 202. The amplified voltage is output from the output terminals 223 and 224 through the emitter follower transistors 208 and 209, respectively.

In addition, the output voltage takes place between the emitters of the transistors 212 and 213 through an emitter follower circuit composed of the transistors 212 and 213. A current corresponding to the output voltage flows in the capacitor 216 connected between the emitters of the transistors 212 and 213.

As shown in FIG. 4, when the capacitor 216 is composed of transistors 231 and 232 that are similar to the transistors 201 and 202 that compose the differential pair, the capacitance $C_C$ of the capacitor 216 becomes almost the same as the capacitance $C_{CB}$ between the base and the collector of each of the transistors 201 and 202.

Thus, the capacitor 216 forms a compensation current that is equal to the current that flows in each of the transistors 201 and 202. When the collectors of the transistors 212 and 213 are connected to the collectors of the transistors 202 and 201, respectively, the current that flows in the capacitance $C_{CB}$ formed between the base and the collector of each of the transistors 201 and 202 is canceled by the compensation current that flows in the capacitor 216. Thus, a differential amplifier having a high gain and a wide frequency band free of the limitation thereof can be accomplished.

As shown in FIG. 3, the output voltages of the transistors 201 and 202 as a differential pair are supplied to the capacitor 216 through the emitter follower transistors 208 and 209 and the emitter follower transistors 212 and 213, respectively. The capacitor 216 disposed between the emitters of the transistors 212 and 213 generates a compensation current that is equal to a current that flows in the capacitance $C_{BC}$ formed between the base and the collector of each of the transistors 201 and 202 as a differential pair. The compensation current causes the current that flows in the capacitance $C_{BC}$ formed between the base and the collector of each of the transistors 201 and 202 as a differential pair to be canceled. Thus, the differential circuit can be free of the limitation of the frequency band.

However, in such a structure, the compensation current is generated corresponding to the output signal voltage detected through the emitter follower transistors 208 and 209 and the emitter follower transistors 212 and 213. Thus, when such a circuit is composed of CMOS transistors, a level shift of 2 $V_{GS}$ takes place (where $V_{GS}$ is the voltage between the gate and the source) due to the compensation current. On the other hand, when such a circuit is composed of MOS transistors, since the voltage $V_{GS}$ between the gate and source is around 1 V, a level shift of around 2 V takes place in the portion that generates the compensation current.

On the other hand, a low voltage power supply structure is becoming the mainstream. In a low voltage circuit, a power supply of for example 3.3 V is used. When a level shift of 2 V takes place in such a low voltage circuit, a sufficient amplitude of signals cannot be secured.

On the other hand, when such a circuit is composed of CMOS transistors, the gain of the source follower of MOS transistors does not become one time due to an influence of the substrate effect. Thus, as was described above, when an output signal voltage is detected through two stages of the follower transistors 208 and 209 and the follower transistors 212 and 213, the amplitude of a detected output voltage is decreased. Consequently, the effect for canceling the parasitic capacitance deteriorates.

OBJECTS AND SUMMARY OF THE INVENTION

Therefore, an object of the present invention is to provide a differential amplifier that has a high gain and a wide frequency band and that operates at low power supply voltage.

Another object of the present invention is to provide a comparator that operates at high speed.

A further object of the present invention is to provide an A/D converter that operates at high speed.

A first aspect of the present invention is a differential amplifier, comprising a differential pair composed of a first transistor and a second transistor whose sources or emitters are connected in common, a buffer means for extracting an output of said differential pair composed of the first transistor and the second transistor, and a compensation current generating means for generating a compensation current that is equal to a current that flows in a parasitic capacitance of each of the first transistor and the second transistor, the direction of the compensation current being the reverse of the current that flows in the parasitic capacitance, wherein said compensating circuit generating means is composed of a voltage input-current output means comprising a third transistor and a fourth transistor, a capacitor equivalent to the parasitic capacitance of each of the first transistor and the second transistor being connected between the sources or the emitters of the third transistor and the fourth transistor, a first current source and a second current source connected to the sources or the emitters of the third transistor and the fourth transistor, and a third current source and a fourth current source connected to the drains or the collectors of the third transistor and the fourth transistor, wherein output voltages of the first transistor and the second transistor are supplied to the gates or the bases of the third transistor and the fourth transistor, and wherein output currents of the drains or the collectors of the fourth transistor and the third transistor are supplied as compensation currents to the drains or the collectors of the second transistor and the first transistor.

A second aspect of the present invention is a comparator, comprising an amplifier, a means for causing the comparator to operate in an auto zero mode and an amp mode, the auto zero mode causing the offset of said amplifier to be canceled, the amp mode causing the input signal to be amplified and output, a means for inputting the input voltage in the auto zero mode and storing the input voltage to a capacitor connected to an input stage of said amplifier, a means for inputting a reference voltage in the amp mode, obtaining the differential voltage between the input voltage stored in the capacitor connected to the input stage of said amplifier and the reference voltage, and outputting the differential voltage from said amplifier, wherein said amplifier comprises a differential pair composed of a first transistor and a second transistor whose sources or emitters are connected in common, a buffer means for extracting an output of the differential pair composed of the first transistor and the second transistor, and a compensation current generating means for generating a compensation current that is equal to a current that flows in a parasitic capacitance of each of the first transistor and the second transistor, the direction of the compensation current being the reverse of the current that flows in the parasitic capacitance, wherein the compensating circuit generating means is composed of a voltage input-current output means comprising a third transistor and a fourth transistor, a capacitor equivalent to the parasitic capacitance of each of the first transistor and the second transistor being connected between the sources or the emitters of the third transistor and the fourth transistor, a first current source and a second current source connected to the sources or the emitters of the third transistor and the fourth transistor, and a third current source and a fourth current source connected to the drains or the collectors of the third transistor and the fourth transistor, wherein output voltages of the first transistor and the second transistor are supplied to the gates or the bases of the third transistor and the fourth transistor, and wherein output currents of the drains or the collectors of the fourth transistor and the third transistor are supplied as compensation currents to the drains or the collectors of the second transistor and the first transistor.

A third aspect of the present invention is a comparator, comprising an amplifier, a means for causing the comparator to operate in an auto zero mode and an amp mode, the auto zero mode causing the offset of said amplifier to be canceled, the amp mode causing the input signal to be amplified and output, a means for inputting a reference voltage in the auto zero mode and storing the reference voltage to a capacitor connected to an input stage of said amplifier, a means for inputting an input voltage in the amp mode, obtaining the differential voltage between the reference voltage stored in the capacitor connected to the input stage of said amplifier and the input voltage, and outputting the differential voltage from said amplifier, wherein said amplifier comprises a differential pair composed of a first transistor and a second transistor whose sources or emitters are connected in common, a buffer means for extracting an output of the differential pair composed of the first transistor and the second transistor, and a compensation current generating means for generating a compensation current that is equal to a current that flows in a parasitic capacitance of each of the first transistor and the second transistor, the direction of the compensation current being the reverse of the current that flows in the parasitic capacitance, wherein the compensating circuit generating means is composed of a voltage input-current output means comprising a third transistor and a fourth transistor, a capacitor equivalent to the parasitic capacitance of each of the first transistor and the second transistor being connected between the sources or the emitters of the third transistor and the fourth transistor, a first current source and a second current source connected to the sources or the emitters of the third transistor and the fourth transistor, and a third current source and a fourth current source connected to the drains or the collectors of the third transistor and the fourth transistor, wherein output voltages of the first transistor and the second transistor are supplied to the gates or the bases of the third transistor and the fourth transistor, and wherein output currents of the drains or the collectors of the fourth transistor and the third transistor are supplied as compensation currents to the drains or the collectors of the second transistor and the first transistor.

A fourth aspect of the present invention is an A/D converter, comprising a reference voltage generating means for generating a plurality of reference voltages that designate quantizing levels, a plurality of comparators for comparing each of the reference voltages and an input voltage, a plurality of latches for latching an output of each of said plurality of comparators, a decoder for generating a digital value corresponding to the input voltage with the output of each of said plurality of latches, wherein each of said plurality of comparators comprises an amplifier, a means for causing the comparator to operate in an auto zero mode and an amp mode, the auto zero mode causing the offset of the amplifier to be canceled, the amp mode causing the input signal to be amplified and output, a means for inputting the input voltage in the auto zero mode and storing the input voltage to a capacitor connected to an input stage of the amplifier, a means for inputting a reference voltage in the amp mode, obtaining the differential voltage between the input voltage stored in the capacitor connected to the input stage of the amplifier and the reference voltage, and outputting the differential voltage from the amplifier, wherein the amplifier comprises a differential pair composed of a first transistor and a second transistor whose sources or emitters are connected in common, a buffer means for extracting an output of the differential pair composed of the first transistor and the second transistor, and a compensation current generating means for generating a compensation current that is equal to a current that flows in a parasitic capacitance of each of the first transistor and the second transistor, the direction of the compensation current being the reverse of the current that flows in the parasitic capacitance, wherein the compensating circuit generating means is composed of a voltage input-current output means comprising a third transistor and a fourth transistor, a capacitor equivalent to the parasitic capacitance of each of the first transistor and the second transistor being connected between the sources or the emitters of the third transistor and the fourth transistor, a first current source and a second current source connected to the sources or the emitters of the third transistor and the fourth transistor, and a third current source and a fourth current source connected to the drains or the collectors of the third transistor and the fourth transistor, wherein output voltages of the first transistor and the second transistor are supplied to the gates or the bases of the third transistor and the fourth transistor, and wherein output currents of the drains or the collectors of the fourth transistor and the third transistor are supplied as compensation currents to the drains or the collectors of the second transistor and the first transistor.

A fifth aspect of the present invention is an A/D converter, comprising a reference voltage generating means for generating a plurality of reference voltages that designate quantizing levels, a plurality of comparators for comparing each of the reference voltages and an input voltage, a plurality of latches for latching an output of each of said plurality of comparators, a decoder for generating a digital value corresponding to the input voltage with the output of each of said plurality of latches, wherein each of said comparator comprises an amplifier, a means for causing the comparator to operate in an auto zero mode and an amp mode, the auto zero mode causing the offset of the amplifier to be canceled, the amp mode causing the input signal to be amplified and output, a means for inputting a reference voltage in the auto zero mode and storing the reference voltage to a capacitor connected to an input stage of the amplifier, a means for inputting an input voltage in the amp mode, obtaining the differential voltage between the reference voltage stored in the capacitor connected to the input stage of the amplifier and the input voltage, and outputting the differential voltage from the amplifier, wherein the amplifier comprises a differential pair composed of a first transistor and a second transistor whose sources or emitters are connected in common, a buffer means for extracting an output of the differential pair composed of the first transistor and the second transistor, and a compensation current generating means for generating a compensation current that is equal to a current that flows in a parasitic capacitance of each of the first transistor and the second transistor, the direction of the compensation current being the reverse of the current that flows in the parasitic capacitance, wherein the compensating circuit generating means is composed of a voltage input-current output means comprising a third transistor and a fourth transistor, a capacitor equivalent to the parasitic capacitance of each of the first transistor and the second transistor being connected between the sources or the emitters of the third transistor and the fourth transistor, a first current source and a second current source connected to the sources or the emitters of the third transistor and the fourth transistor, and a third current source and a fourth current source connected to the drains or the collectors of the third transistor and the fourth transistor, wherein output voltages of the first transistor and the second transistor are supplied to the gates or the bases of the third transistor and the fourth transistor, and wherein output currents of the drains or the collectors of the fourth transistor and the third transistor are supplied as compensation currents to the drains or the collectors of the second transistor and the first transistor.

According to the present invention, an OTA circuit is disposed between a differential pair composed of NMOS transistors and an NMOS follower transistor that composes an output buffer circuit. The OTA circuit generates a compensation current that is equal to a current that flows in a capacitance formed between the gate and the drain of each of the differential pair transistors and that flows in the reverse direction thereof. The compensation current cancels the current that flows in the capacitance formed between the gate and the drain of each of the differential pair transistors. Thus, a differential amplifier that has a high accuracy and, high gain, and a wide frequency band and that operates at a low power voltage can be accomplished.

According to the present invention, using a differential amplifier having a high gain and a wide frequency band, a comparator that operates at high speed and an A/D converter using such a comparator can be accomplished.

These and other objects, features and advantages of the present invention will become more apparent in light of the following detailed description of a best mode embodiment thereof, as illustrated in the accompanying drawings.

BRIEF DESCRIPTION OF THE DRAWINGS

FIGS. 10A, 10B, 10C, 10D, 10E, 10F, and 10G are timing charts for explaining an example of the comparator according to the present invention;

FIGS. 12A and 12B are schematic diagrams showing blocks of another example of the comparator according to the present invention;

FIGS. 13A, 13B, 13C, 13D, 13E, 13F, and 13G are timing charts for explaining another example of the comparator according to the present invention;

DETAILED DESCRIPTION OF THE PREFERRED EMBODIMENTS

Next, with reference to the accompanying drawings, embodiments of the present invention will be described.

Figure 1:
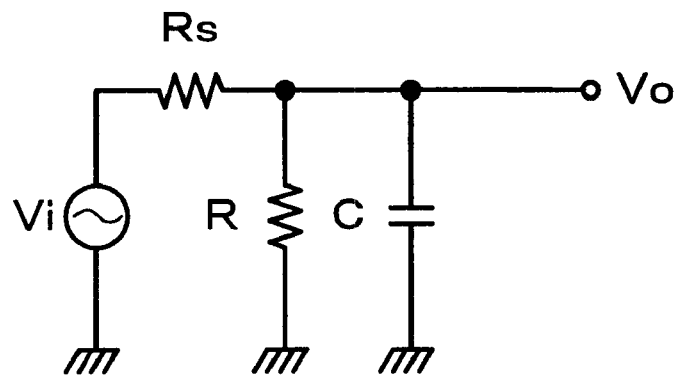
FIG. 1 is a schematic diagram showing an equivalent circuit for explaining a conventional comparator.
Figure 2:
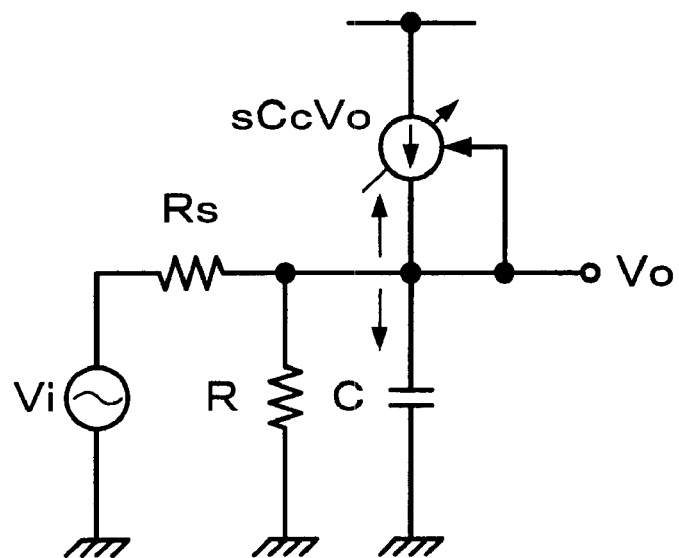
FIG. 2 is a schematic diagram showing an equivalent circuit for explaining a conventional comparator.
Figure 3:
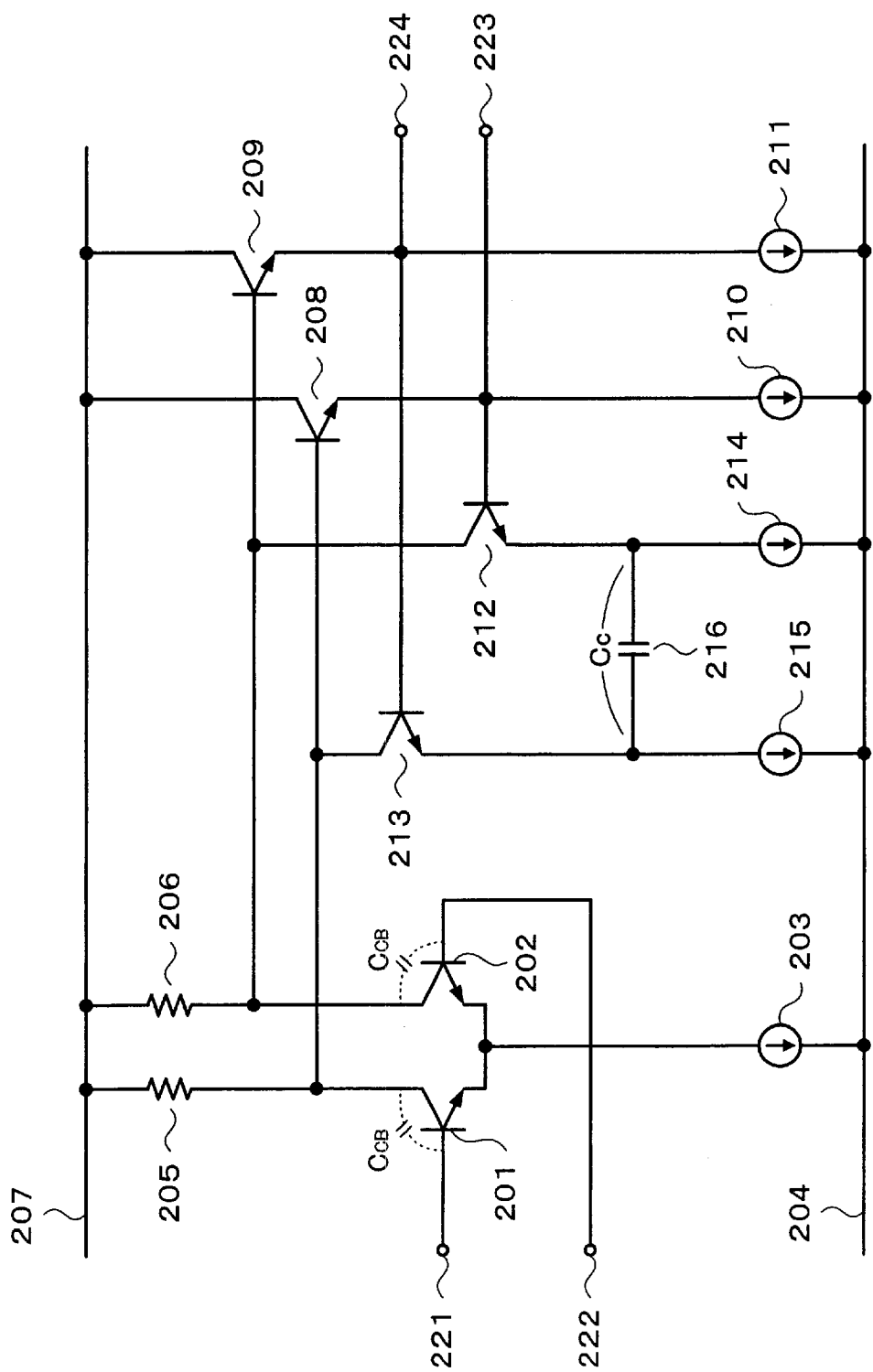
FIG. 3 is a circuit diagram for explaining a conventional comparator.
Figure 4:
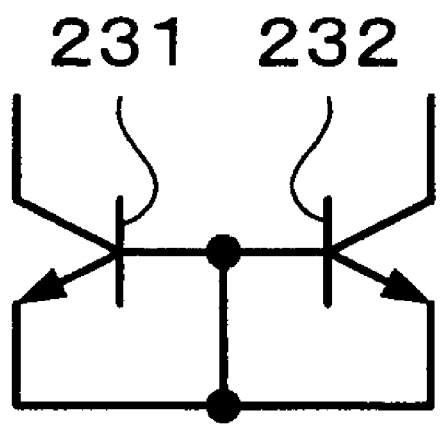
FIG. 4 is a circuit diagram for explaining an example of a conventional comparator.
Figure 5:
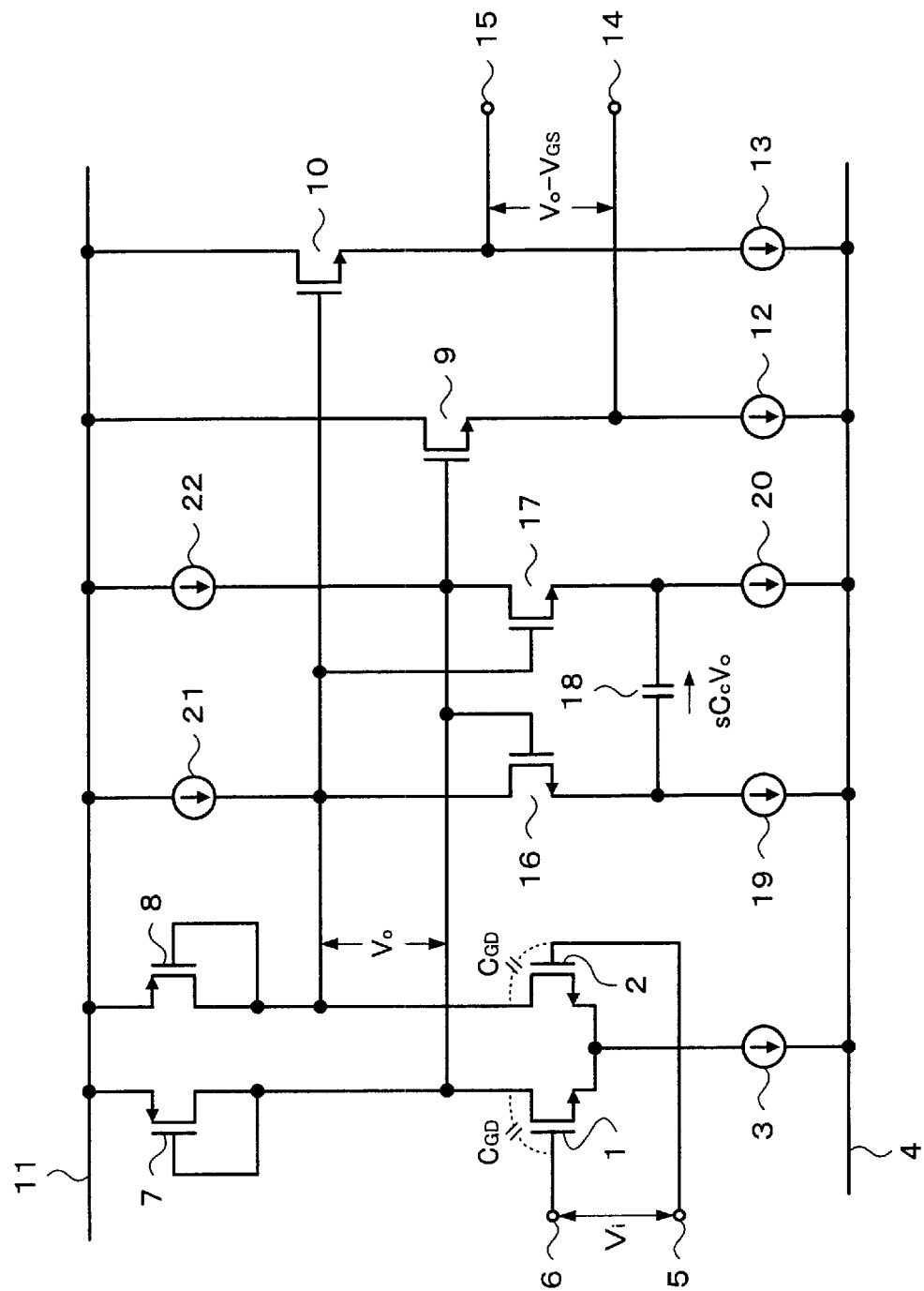
FIG. 5 is a circuit diagram showing a differential amplifier according to the present invention.

1. A/D converter
2. Example of comparator
3. Another example of comparator
4. Example of application
5. Differential amplifier FIG. 5 shows an example of a differential amplifier according to the present invention. In FIG. 5, a differential pair is composed of NMOS transistors 1 and 2. The source of the NMOS transistor 1 and the source of the NMOS transistor 2 are connected each other. The connected point of the sources of the NMOS transistors 1 and 2 is connected to a ground line 4 through a current source 3. The gate of the NMOS transistor 1 and the gate of the NMOS transistor 2 are connected to input terminals 5 and 6, respectively.

PMOS transistors 7 and 8 compose load circuits against the differential pair composed of the NMOS transistors 1 and 2. The gate and the drain of the PMOS transistor 7 are connected. The connected point of the gate and the drain of the PMOS transistor are connected to the drain of the NMOS transistor 1. In addition, the connected point is connected to the gate of an NMOS transistor 9. Likewise, the gate and the drain of the PMOS transistor 8 are connected. The connected point of the gate and the drain of the PMOS transistor 8 are connected to the drain of the NMOS transistor 2. In addition, the connected point is connected to the gate of an NMOS transistor 10. The sources of the PMOS transistors 7 and 8 are connected to a power line 11.

The NMOS transistors 9 and 10 are source follower transistors as buffers that extract output voltages of the differential pair composed of the NMOS transistors 1 and 2. The source of the MMOS transistor 9 is connected to the ground line 4 through a current source 12. In addition, the source of the NMOS transistor 9 is connected to an output terminal 14. The source of the NMOS transistor 10 is connected to the ground line 4 through a current source 13. In addition, the source of the NMOS transistor 10 is connected to an output terminal 15. The drains of the NMOS transistors 9 and 10 are connected to the power line 11.

NMOS transistors 16 and 17, a capacitor 18, and current sources 19, 20, 21, and 22 generate a compensation current having the same current value as the current that flows in a capacitance $C_{GD}$ formed between the gate and the drain of each of the NMOS transistors 1 and 2.

The source of the NMOS transistor 16 and the source of the NMOS transistor 17 are connected to the ground line 4 through the current source 19 and the current source 20, respectively. The capacitor 18 is connected between the source of the NMOS transistor 16 and the source of the NMOS transistor 17. The gates of the NMOS transistors 16 and 17 are connected to the drains of the NMOS transistors 1 and 2, respectively. The drains of the NMOS transistors 16 and 17 are connected to the power line 11 through the current sources 21 and 22, respectively. In addition, the drains of the NMOS transistors 16 and 17 are connected to the drains of the transistors 2 and 1, respectively.

In the differential circuit shown in FIG. 5, a differential input voltage $V_i$ is supplied to the input terminals 5 and 6. The differential input voltage $V_i$ is amplified by the differential pair composed of the NMOS transistors 1 and 2. An output voltage $V_O$ of the differential pair composed of the NMOS transistors 1 and 2 is output from the differential output terminals 14 and 15 through the source follower transistors 9 and 10.

The output voltage $V_O$ of the differential pair composed of the NMOS transistors 1 and 2 is supplied to a circuit composed of the NMOS transistors 16 and 17, the capacitor 18, and the current sources 19, 20, 21, and 22. The circuit generates a compensation current corresponding to the output voltage $V_O$ of the differential pair composed of the NMOS transistors 1 and 2.

Figure 6:
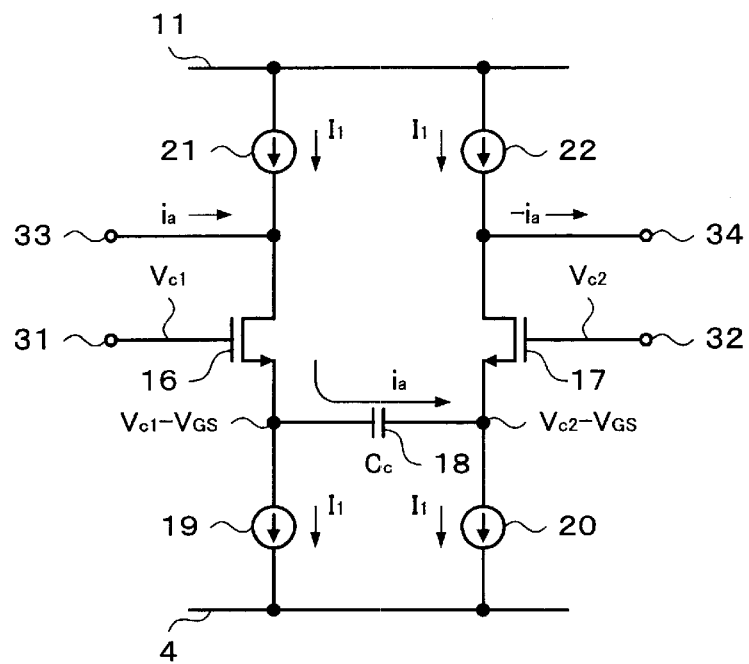
FIG. 6 is a circuit diagram for explaining a differential amplifier according to the present invention.

In other words, as shown in FIG. 6, the capacitor 18 is connected between the source of the NMOS transistor 16 and the source of the NMOS transistor 17. Assuming that the capacitance of the capacitor 18 is denoted by $C_C$, when the voltages $v_{c1}$ and $v_{c2}$ are supplied to voltage input terminals 31 and 32 connected to the gates of the NMOS transistors 16 and 17, respectively, the source voltages of the NMOS transistors 16 and 17 are expressed by $(v_{c1}-V_{GS})$ and $(V_{c2}-V_{GS})$ respectively. Thus, a current $i_a$ corresponding to the differential voltage of the voltages $v_{c1}$ and $v_{c2}$ supplied to the voltage input terminals 31 and 32 flows. Assuming that the capacitance of the capacitor 18 is denoted by $C_C$, the current $i_a$ can be expressed by the following formula.

$i_a = sC_C \cdot (v_{c1}-v_{c2})$ (where s is Laplace operator).

Since the current that flows from each of the current sources 19 and 20 connected to the sources of the NMOS transistors 16 and 17 and the current sources 21 and 22 connected to the drains of the NMOS transistors 16 and 17 is a constant current $I_1$, the current $i_a$ that flows in the capacitor 18 disposed between the sources of the NMOS transistors 16 and 17 is input and output from current output terminals 33 and 34 of the drains of the NMOS transistors 16 and 17, respectively.

Thus, the circuit composed of the NMOS transistors 16 and 17, the capacitor 18, and the current sources 19, 20, 21, and 22 is a circuit that outputs a current corresponding to the differential voltage of the voltages supplied to the input terminals 31 and 32. Such a structure is referred to as OTA (Operational Transconductance Amplifier).

As shown in FIG. 5, the gates of the NMOS transistors 16 and 17 are connected to the drains of the NMOS transistors 1 and 2, respectively. The drains of the NMOS transistors 16 and 17 are connected to the drains of the NMOS transistors 2 and 1, respectively. Thus, as an input voltage of the circuit composed of the NMOS transistors 16 and 17, the capacitor 18, and the current sources 19, 20, 21, and 22, the differential voltage $V_O$ that is an output voltage of the differential pair composed of the NMOS transistors 1 and 2 is supplied. The circuit composed of the NMOS transistors 16 and 17, the capacitor 18, and the current sources 19, 20, 21, and 22 generates a current $sC_CV_O$. The current $sC_CV_O$ becomes an output current of the circuit composed of the NMOS transistors 16 and 17, the capacitor 18, and the current sources 19, 20, 21, and 22. The current $sC_CV_O$ is added to currents that flow in the NMOS transistors 1 and 2.

Figure 7:
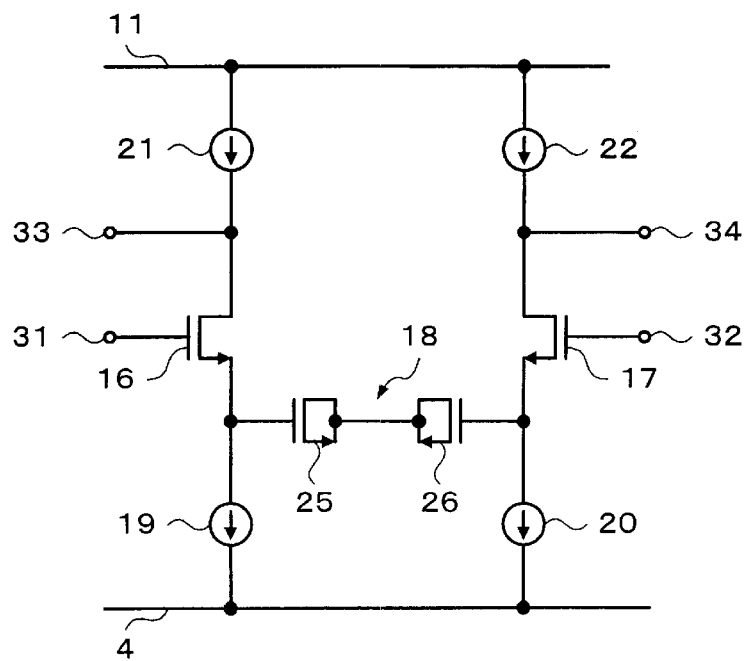
FIG. 7 is a circuit diagram for explaining a differential amplifier according to the present invention.

As shown in FIG. 7, when the capacitor 18 is composed of transistors 25 and 26 that are similar to the NMOS transistors 1 and 2, the capacitance $C_C$ of the capacitor 18 becomes almost the same as the capacitance $C_{GD}$ formed between the gate and the drain of each of the NMOS transistors 1 and 2.

Thus, the compensation current $sC_CV_O$ is generated, which is equal to the current that flows in the capacitance $C_{GD}$ formed between the gate and the drain of each of the NMOS transistors 1 and 2. The compensation current cancels the current that flows in the capacitance $C_{GD}$ formed between the gate and the drain of each of the NMOS transistors 1 and 2. Thus, as was described in Formula (6), a differential amplifier having a wide frequency band free of the limitation of the frequency band can be accomplished.

In the example, the OTA circuit composed of the NMOS transistors 16 and 17, the capacitor 18, and the current sources 19, 20, 21, and 22 is disposed between the differential pair composed of the NMOS transistors 1 and 2 and the NMOS follower transistors 9 and 10 composing the output buffer circuit. The OTA circuit generates the compensation current $sC_CV_O$ that is equal to the current that flows in the capacitance $C_{GD}$ formed between the gate and the drain of each of the NMOS transistors 1 and 2. Thus, the current that flows in the capacitance $C_{GD}$ formed between the gate and the drain of each of the NMOS transistors 1 and 2 is canceled. Consequently, the frequency band of the differential amplifier is widened. In the case, the differential voltage that is output from the NMOS transistors 1 and 2 composing the differential pair is detected without need to use a source follower buffer circuit. Thus, the power voltage can be lowered without a tradeoff of a large level shift. The level shift is only $V_{GS}$ of one stage of the source follower transistors 9 and 10. In addition, an error due to a gain drop of the substrate effect is only $V_{GS}$ of one stage of the NMOS transistors 9 and 10. Thus, the accuracy of the differential amplifier improves.

2. A/D Converter

As was described above, the OTA circuit composed of the NMOS transistors 16 and 17, the capacitor 18, and the current sources 19, 20, 21, and 22 is disposed between the differential pair composed of the NMOS transistors 1 and 2 and the NMOS transistors 9 and 10 composing the output buffer circuit. The OTA circuit generates a compensation current that is equal to the current that flows in the capacitance $C_{GD}$ formed between the gate and the drain of each of the NMOS transistors 1 and 2. The compensation current cancels the current that flows in the capacitance formed between the gate and the drain of each of the NMOS transistors 1 and 2. Thus, a CMOS differential amplifier that has a high gain and a wide frequency band and that operates at low power voltage can be accomplished.

Such a differential circuit is suitable for a circuit that operates at high speed such as a comparator used in an A/D converter that digitizes a reproduction signal of a head in a hard disk drive.

Figure 8:
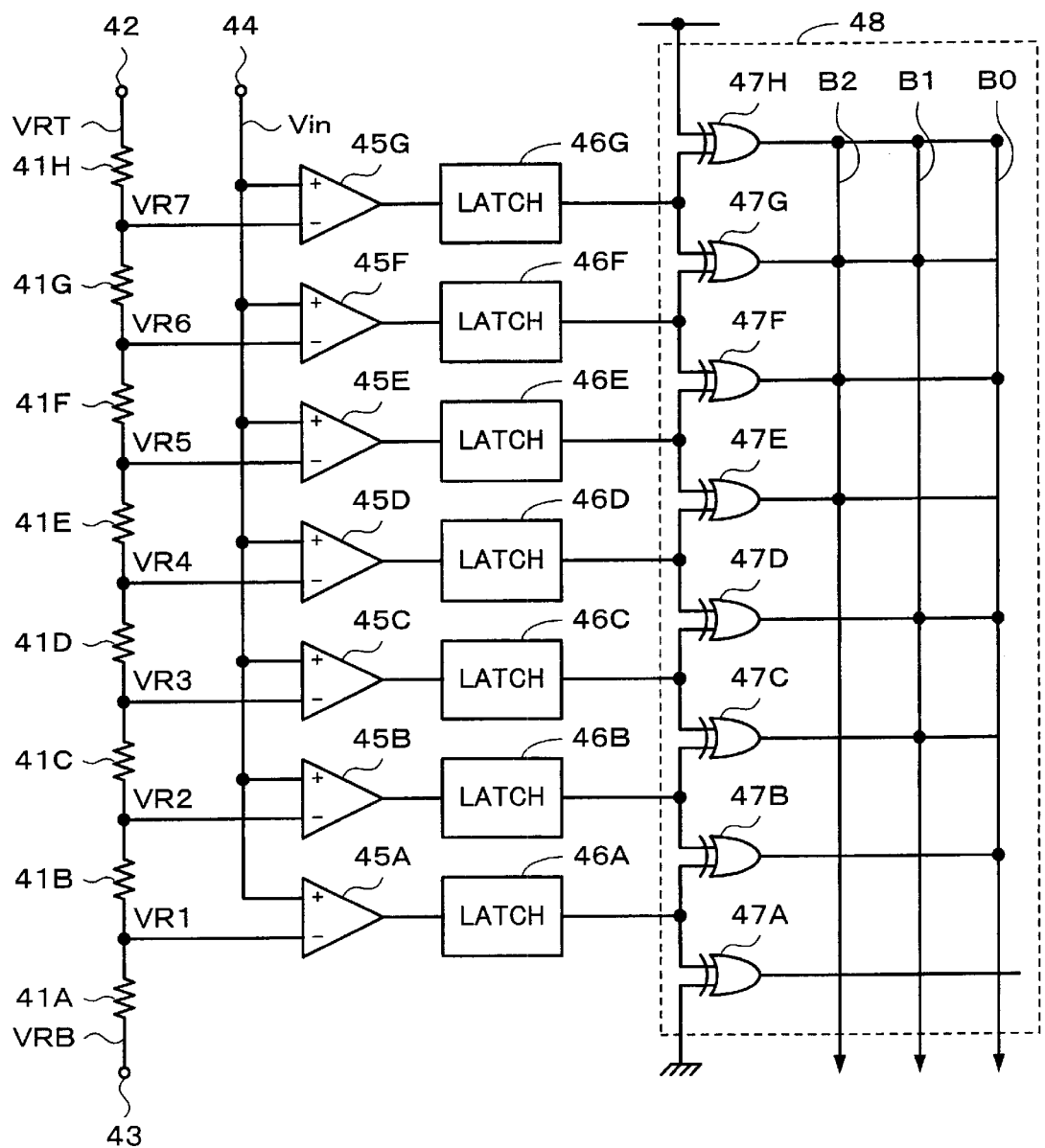
FIG. 8 is a circuit diagram showing an example of an A/D converter according to the present invention.

FIG. 8 shows an example of an A/D converter that accomplishes such a high-speed process. In FIG. 8, a tandem connection of resistors 41A, 41B, 41C, 41D, 41E, 41F, 41G and 41H is disposed between a power supply terminal 42 of a power supply voltage VRT and a power supply terminal 43 of a power supply voltage VRB. Reference voltages VR1, VR2, VR3, VR4, VR5, VR6, and VR7 are generated between resistors 41A and 41B, between resistors 41B and 41C, between resistors 41C and 41D, between resistors 41D and 41E, between resistors 41E and 41F, between resistors 41F and 41G, between resistors 41G and 41H, respectively. The resistance values of the resistors 41A to 41H correspond to quantizing steps. The reference voltages VR1, VR2, VR3, . . . designate quantizing steps of the A/D converting process.

The reference voltages VR1 to VR7 among the resistors 41A to 41H are supplied to first input terminals of comparators 45A to 45G, respectively. An input voltage $V_{in}$ is supplied from an input terminal 44 to second input terminals of the comparators 45A to 45G. The comparators 45A to 45G compare the reference voltages VR1 to VR7 with the input voltage $V_{in}$, respectively.

Output voltages of the comparators 45A, 45B, 45C, 45D, 45E, 45F, and 45G are supplied to latches 46A, 46B, 46C, 46D, 46E, 46F, and 46G, respectively. The latches 46A to 46G latch the output voltages of the comparators 45A to 45G, respectively. The output voltages of the latches 46A to 46G are supplied to a decoder 48.

The decoder 48 has EX-OR gates 47A, 47B, 47C, 47D, 47E, 47F, 47G, and 47H and bit lines B0, B1, and B2. The output voltages of the latches 46A to 46G are supplied to the EX-OR gates 47A to 47H, respectively. The bit lines B0, B1, and B2 are connected corresponding to output values.

An "L" level voltage is supplied to a first input terminal of the EX-OR gate 47A. An output voltage of the latch circuit 46A is supplied to the EX-OR gates 47A and 47B. An output voltage of the latch circuit 46B is supplied to the EX-OR gates 47B and 47C. An output voltage of the latch circuit 46C is supplied to the EX-OR gates 47C and 47D. An output voltage of the latch circuit 46D is supplied to the EX-OR gates 47D and 47E. An output voltage of the latch circuit 46E is supplied to the EX-OR gates 47E and 47F. An output voltage of the latch circuit 46F is supplied to the EX-OR gates 47F and 47G. An output voltage of the latch circuit 46G is supplied to the EX-OR gates 47G and 47H. An "H" level voltage is supplied to a second input terminal of the EX-OR gate 47H.

Output terminals of the EX-OR gates 47A to 47H are connected to the bit lines B0, B1, and B2 corresponding to the output data.

In other words, an output terminal of the EX-OR gate 47A is not connected to any bit line. An output terminal of the EX-OR gate 47B is connected to the bit line B0. An output terminal of the EX-OR gate 47C is connected to the bit line B1. An output terminal of the EX-OR gate 47D is connected to the bit lines B1 and B0. An output terminal of the EX-OR gate 47E is connected to the bit line B2. An output terminal of the EX-OR gate 47F is connected to the bit lines B2 and B0. An output terminal of the EX-OR gate 47G is connected to the bit lines B2 and B1. An output terminal of the EX-OR gate 47H is connected to the bit lines B2, B1, and B0.

Thus, the decoder 48 outputs digital data corresponding to an analog level of the input voltage $V_{in}$.

Assuming that the input voltage $V_{in}$ is in the range from the reference voltage VR4 to the reference voltage VR5, the comparators 45A, 45B, 45C, and 45D that compare reference voltages that are lower than the reference voltage VR4 with the input voltage $V_{in}$ output "L" level voltages. The comparators 45E, 45F, and 45G that compare reference voltages that are higher than the reference voltage VR5 with the input voltage $V_{in}$ output "H" level voltages. The output voltages of the comparators 45A to 45G are supplied to the latches 46A to 46G, respectively. The output voltages of the latches 46A to 46G are supplied to the EX-OR gates 47A to 47H, respectively.

In that case, the comparators 45A, 45B, 45C, and 45D that compare reference voltages that are lower than the reference voltage VR4 with the input voltage $V_{in}$ output "L" level voltages. The comparators 45E, 45F, and 45G that compare reference voltages that are higher than the reference voltage VR5 with the input voltage $V_{in}$ output "H" level voltages. Thus, only the EX-OR gate 47E outputs an "H" level voltage. The other EX-OR gates output "L" level voltages. Since the EX-OR gate 47E outputs an "H" level voltage, the decoder 48 outputs "100".

3. Example of Comparator

As the comparators 45A to 45G of the A/D converter, chopper type comparators are used.

Figure 9A:
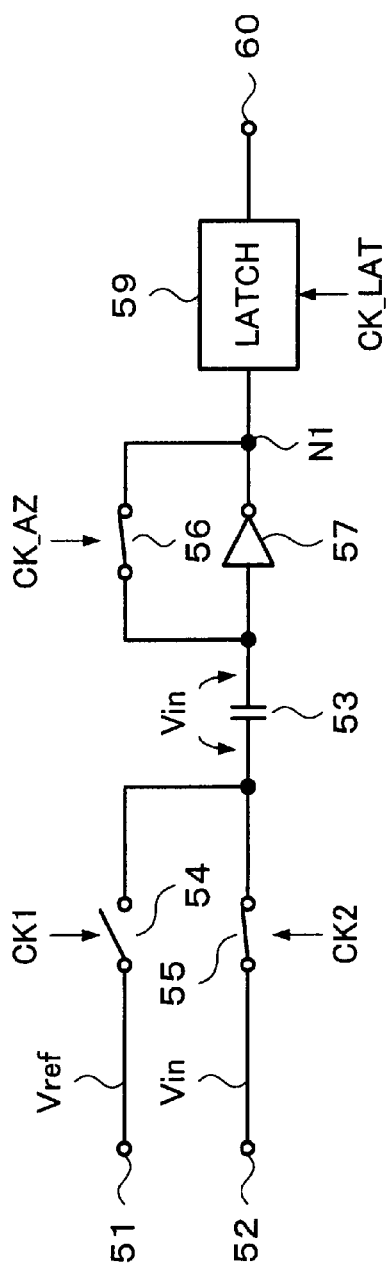
FIGS. 9A and 9B are schematic diagrams showing blocks as an example of a comparator according to the present invention.
Figure 9B:
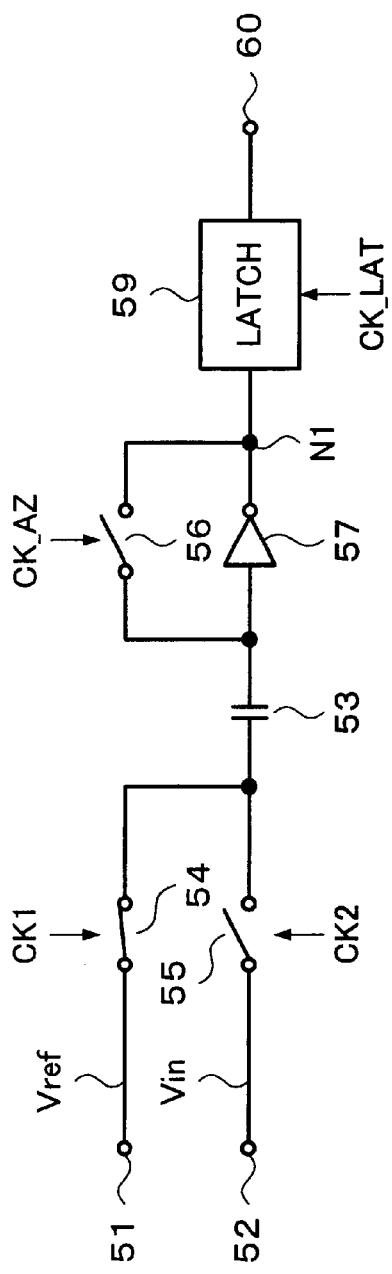

FIGS. 9A and 9B are circuit diagrams for explaining a basic operation of a chopper type comparator. As shown in FIGS. 9A and 9B, a switch circuit 54 is disposed between an input terminal 51 of a reference voltage $V_{ref}$ and a first terminal of a capacitor 53. A switch circuit 55 is disposed between an input terminal 52 of an input voltage $V_{in}$ and the first terminal of the capacitor 53. A second terminal of the capacitor 53 is connected to an input terminal of an amplifier 57. A switch circuit 56 is disposed between the input terminal of the amplifier 57 and an inverted output terminal. An output terminal 58 of the amplifier 57 is connected to a latch circuit 59. An output voltage of the latch circuit 59 is output from an output terminal 60.

A chopper type comparator has two modes that are an auto zero mode and an amp mode that alternately take place. As shown in FIG. 9A, in the auto zero mode, the switch circuit 56 is turned on. Thus, a negative feedback takes place. Since the voltage of the node N1 becomes zero, the offset is canceled.

Thus, in this state, when the switch circuit 55 is turned on, the input voltage $V_{in}$ is input from the input terminal 52 and stored in the capacitor 53.

As shown in FIG. 9B, in the amp mode, the switch circuit 56 is turned off. At that point, when a voltage is input to the amplifier 57, the voltage is amplified by the amplifier 57 and output. As shown in FIG. 9A, in the auto zero mode, since the input voltage $V_{in}$ is stored in the capacitor 53. When the switch circuit 54 is turned on in the amp mode, a differential voltage between the input voltage $V_{in}$ stored in the capacitor 53 and the reference voltage $V_{ref}$ of the input terminal 51 is amplified by the amplifier 57. When a latch clock signal CK_LAT is supplied to the latch circuit 59, the differential voltage between the input voltage $V_{in}$ and the reference voltage $V_{ref}$ is latched by the latch circuit 59.

FIGS. 10A, 10B, 10C, 10D, 10E, 10F, and 10G are timing charts showing an operation of such a chopper type comparator. In the example, the input voltage $V_{in}$ causes the copper type comparator to operate in the auto zero mode. As shown in FIGS. 9A and 9B, a clock signal CK1 is supplied to the switch circuit 54. A clock signal CK2 is supplied to the switch circuit 55. An auto zero clock signal CK_AZ is supplied to the latch circuit 59.

Since the input voltage $V_{in}$ causes the comparator to operate in the auto zero mode, as shown in FIGS. 10B and 10C, the phase of the clock signal CK2 that causes the switch circuit 55 to be turned on/off is the same as the phase of a clock signal CK_AZ that causes the switch circuit 56 to be turned on/off. As shown in FIG. 10A, since the reference voltage is input in the amp mode, the phase of the clock signal CK1 is reverse of the phase of the clock signal CK_AZ. As shown in FIG. 10D, at a timing of which the output voltage of the amplifier 57 is settled in the amp mode, the signal level of the latch clock signal CK_LAT becomes low. At the timing, the output voltage of the amplifier 57 is latched to the latch circuit 59.

In the case, it is assumed that the input voltage $V_{in}$ is varied against the reference voltage $V_{ref}$ as shown in FIG. 10G.

The comparator operates in the auto zero mode at times $t_1$, $t_3$, $t_5$, . . . of which the signal level of the clock signal CK_AZ (see FIG. 10C) becomes high. As shown in FIG. 10E, the voltage $v_{ob}$ at the node N as the output voltage of the amplifier 57 becomes "0". In the state, the input voltage $V_{in}$ supplied from the input terminal 52 is stored in the capacitor 53.

At times $t_2$, $t_4$, $t_6$, . . . of which the signal level of the clock signal CK_AZ becomes low, the comparator operates in the amp mode. As shown in FIG. 10E, the voltage $V_{ob}$ at the node N1 as the output voltage of the amplifier 57 becomes a differential voltage between the reference voltage $V_{re}$ and the input voltage $V_{in}$. The voltage $v_{ob}$ at the node N1 as the output voltage of the amplifier 57 is latched to the latch circuit 59 at a timing of which the signal level of the latch clock signal CK_LAT becomes low. A voltage $V_{cpo}$ shown in FIG. 10F is extracted from the latch circuit 59.

As the amplifier 57 that structures such a comparator, the differential amplifier shown in FIG. 5 can be used.

Figure 11:
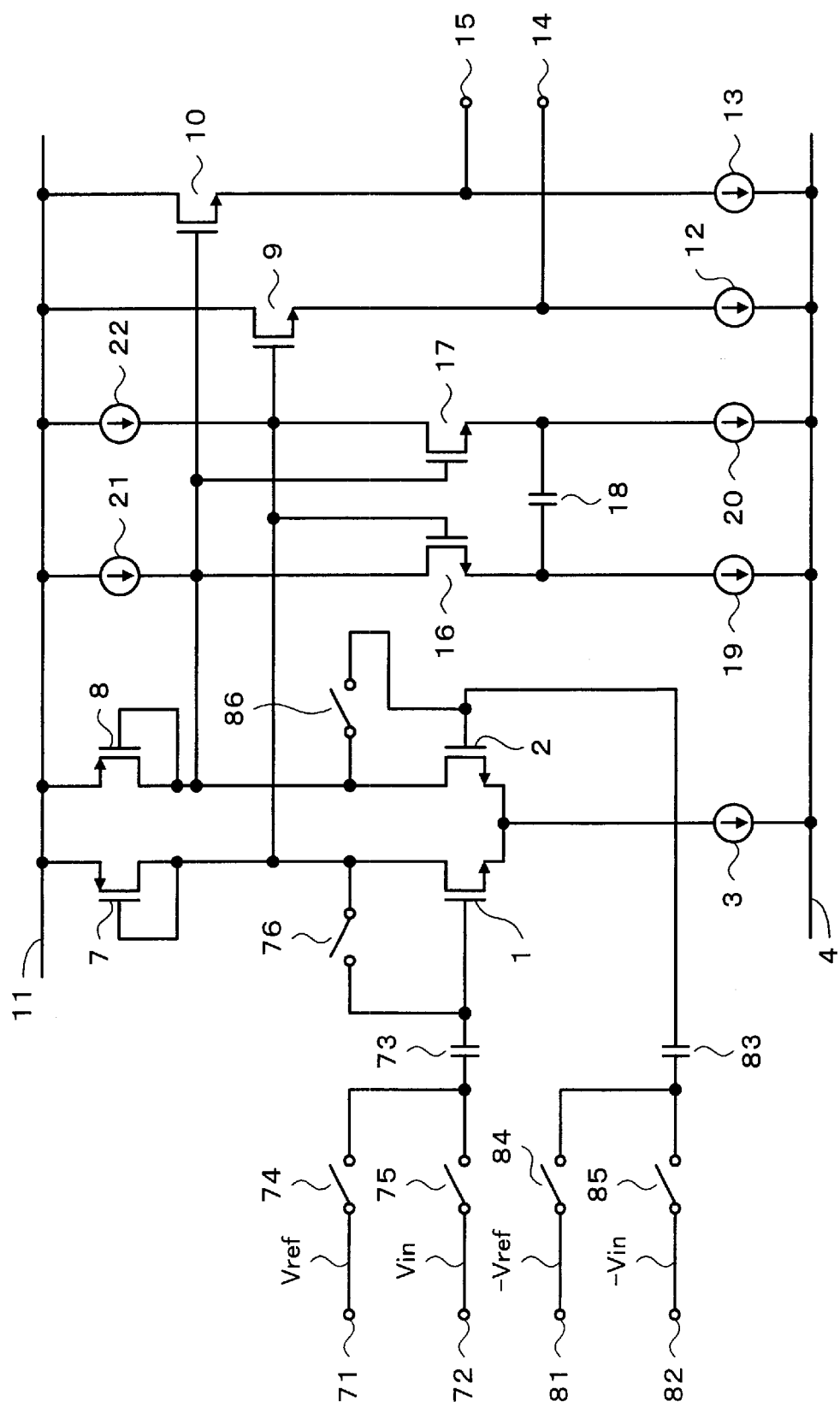
FIG. 11 is a circuit diagram showing an example of a comparator according to the present invention.

FIG. 11 shows an example of the structure of the above-described chopper type comparator using the differential amplifier shown in FIG. 5. As shown in FIG. 11, a switch circuit 74 is disposed between an input terminal 71 of a normal phase reference voltage $V_{ref}$ and a first terminal of a capacitor 73. A switch circuit 75 is disposed between a normal phase input voltage $V_{in}$ and the first terminal of the capacitor 73. A second terminal of the capacitor 73 is connected to the gate of the NMOS transistor 1. A switch circuit 76 is disposed between the gate and the drain of the NMOS transistor 1.

A switch circuit 84 is disposed between an input terminal 81 of a reverse phase reference voltage $-V_{ref}$ and a first terminal of a capacitor 83. A switch circuit 85 is disposed between an input terminal 82 of a reverse phase input voltage $-V_{in}$ and the first terminal of the capacitor 83. A second terminal of the capacitor 83 is connected to the gate of the NMOS transistor 2. A switch circuit 86 is disposed between the gate and the drain of the NMOS transistor 2.

In the auto zero mode, the switch circuit 76 and the switch circuit 86 are turned on. In addition, the switch circuit 75 and the switch circuit 85 are turned on. Thus, the comparator operates in the auto zero mode. As a result, the normal phase input voltage $V_{in}$ and the reverse phase input voltage $-V_{in}$ supplied from the input terminal 72 and the input terminal 82 are stored to the capacitor 73 and the capacitor 83, respectively.

In the amp mode, the switch circuit 76 and the switch circuit 86 are turned off. The switch circuit 74 and the switch circuit 84 are turned on. Thus, the differential voltages of the forward phase input voltage $V_{in}$ and the reverse phase input voltage $-V_{in}$ stored in the capacitor 73 and the capacitor 83 and the normal phase reference voltage $V_{ref}$ and the reverse phase reference voltage $-V_{ref}$ that are supplied form the input terminal 71 and the input terminal 81 are amplified and output from the output terminal 14 and the output terminal 15, respectively.

4. Another Example of Comparator

In the above-described comparator, after the input voltage causes the comparator to operate in the auto zero mode, the comparator operates in the amp mode. The differential voltage between the input voltage and the reference voltage is amplified. In the case, since the comparator operates in the auto zero mode at intervals of each clock pulse, the accuracy improves.

However, it is difficult to cause the comparator to switch between the auto zero mode and the amp mode at high speed. In addition, when the mode of the comparator is switched at high speed, kickback noise may take place.

FIGS. 12A and 12B show the comparator operating in the amp mode, such that the differential voltage between the input voltage and the reference voltage is amplified. By not operating at intervals of each clock pulse, the comparator of FIGS. 12A and 12B is in contrast to the structure wherein the reference voltage causes the comparator to operate in the auto zero mode.

In the example shown in FIGS. 9A and 9B, in the auto zero mode, the input voltage $V_{in}$ is stored in the capacitor 53. However, in the example shown in FIGS. 12A and 12B, in the auto zero mode, the reference voltage $V_{ref}$ is stored in a capacitor 93.

In that case, in the auto zero mode, as shown in FIG. 12A, a switch circuit 96 is turned on. Thus, since a negative feedback takes place, the voltage at the node N2 becomes zero. In the state, a switch circuit 94 is turned on. The reference voltage $V_{ref}$ is input from an input terminal 91. The reference voltage $V_{ref}$ is stored to the capacitor 93.

As shown in FIG. 12B, in the amp mode, the switch circuit 96 is turned off. Thereafter, a switch circuit 95 is turned on. Thus, the input voltage $V_{in}$ is input from an input terminal 92. FIG. 13A shows that while in the auto zero mode, the reference voltage Vref is stored to the capacitor 93. When the switch circuit 95 is turned on in the amp mode, the differential voltage between the reference voltage Vref stored in the capacitor 93 and the input voltage Vin that is input from the input terminal 92 is amplified and output.

Electric charges stored in the capacitor 93 corresponding to the reference voltage $V_{ref}$ in the auto zero mode are held for a while. Thus, it is not necessary to cause the comparator to operate in the auto zero mode at intervals of each clock pulse. In the amp mode, the amplifier 97 successively outputs the differential voltage between the reference voltage $V_{ref}$ and the input voltage $V_{in}$. Thus, it is not necessary to cause the comparator to operate in the auto zero mode at intervals of each clock pulse.

FIGS. 13A, 13B, 13C, 13D, 13E, 13F, and 13G are timing charts for explaining the operation in the case that a reference voltage is input in the auto zero mode.

As shown in FIGS. 12A and 12B, a clock signal CK1 is supplied to the switch circuit 94. A clock signal CK2 is supplied to the switch circuit 95. An auto zero clock signal CK_AZ is supplied to the switch circuit 96. A latch clock signal CK_LAT is supplied to a latch circuit 99.

Since the reference voltage $V_{ref}$ causes the comparator to operate in the auto zero mode, as shown in FIGS. 13A and 13C, the phase of the clock signal CK1 that causes the switch circuit 94 to be turned on/off is the same as the phase of the clock signal CK_AZ that causes the switch circuit 96 to be turned on/off. Since the input voltage $V_{in}$ is input in the amp mode, as shown in FIG. 13B, the phase of the clock signal CK2 is reverse of the phase of each of the clock signal CK1 and the clock signal CK_AZ. When the signal level of the latch clock signal CK_LAT shown in FIG. 13D becomes low, the output voltage of the amplifier 97 is latched by the latch circuit 99.

Now, it is assumed that the input voltage $V_{in}$ is varied against the reference voltage $V_{ref}$ as shown in FIG. 13G.

The comparator operates in the auto zero mode at time $t_{11}$ of which the signal level of the clock signal CK_AZ becomes high. As shown in FIG. 13E, the voltage $V_{ob}$ at the node N2 as the output voltage of the amplifier 97 becomes "0". In this state, the reference voltage $V_{ref}$ supplied from the input terminal 91 is stored to the capacitor 93. The comparator operates in the amp mode at time $t_{12}$ of which the signal level of the clock signal CK_AZ becomes low. As shown in FIG. 13E, the voltage $V_{ob}$ at the node N2 as the output voltage of the amplifier 97 becomes the differential voltage between the reference voltage $V_{ref}$ and the input voltage $V_{in}$. The voltage $v_{ob}$ at the node N2 as the output voltage of the amplifier 97 is latched by the latch circuit 99 at a timing of which the signal level of the latch clock signal CK_LAT becomes low. A reference voltage $V_{ref}$ shown in FIG. 13F is extracted from the latch circuit 99.

In the example, in the auto zero mode, the reference voltage $V_{ref}$ is input. The reference voltage $V_{ref}$ is stored to the capacitor 93. In the amp mode, the differential voltage between the reference-voltage $V_{ref}$ stored in the capacitor 93 and the input voltage $V_{in}$ supplied from the input terminal 92 is amplified by the amplifier 97. Thus, it is necessary to cause the comparator to operate in the auto zero mode at intervals of each clock pulse.

Figure 14:
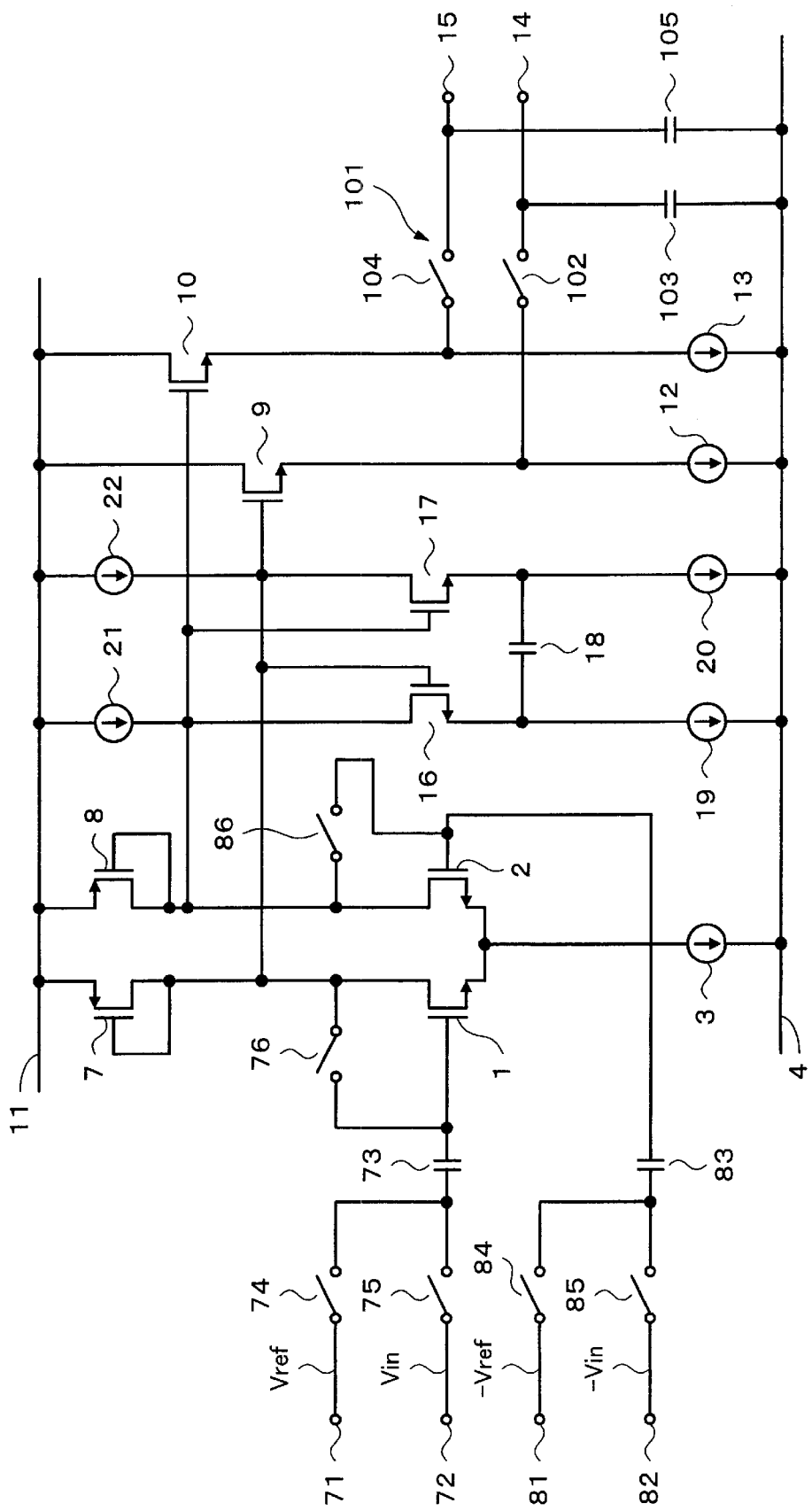
FIG. 14 is a circuit diagram showing another example of the comparator according to the present invention.

As the amplifier 97 that composes such a comparator, the differential amplifier shown in FIG. 5 can be used. FIG. 14 shows an example of the structure of the above-described chopper type comparator using the differential amplifier shown in FIG. 5.

When the comparator does not operate in the auto zero mode at intervals of each clock pulse, since the input voltage is not held corresponding to each clock pulse, the sample hold function is lost. To solve such a problem, in the example shown in FIG. 14, a track hold circuit 101 is disposed on the output side of the amplifier.

In other words, a switch circuit 102 is disposed between the source of the NMOS transistor 9 and the output terminal 14. A capacitor 103 is disposed between the output terminal 14 and the ground line 4. A switch circuit 104 is disposed between the source of the NMOS transistor 10 and the output terminal 15. A capacitor 105 is disposed between the output terminal 15 and the ground line 4.

The switch circuit 102 and the switch circuit 104 are turned on corresponding to each clock pulse. When the switch circuit 102 and the switch circuit 104 are turned on, output voltages of the sources of the source follower transistors 9 and 10 are held by the capacitors 103 and 105, respectively.

The track hold circuit 101 settles the output voltage of the amplifier corresponding to each clock pulse. Thus, the operation of the latch becomes stable.

The structure of the other portions of the comparator shown in FIG. 14 is the same as that shown in FIG. 11.

Figure 15:
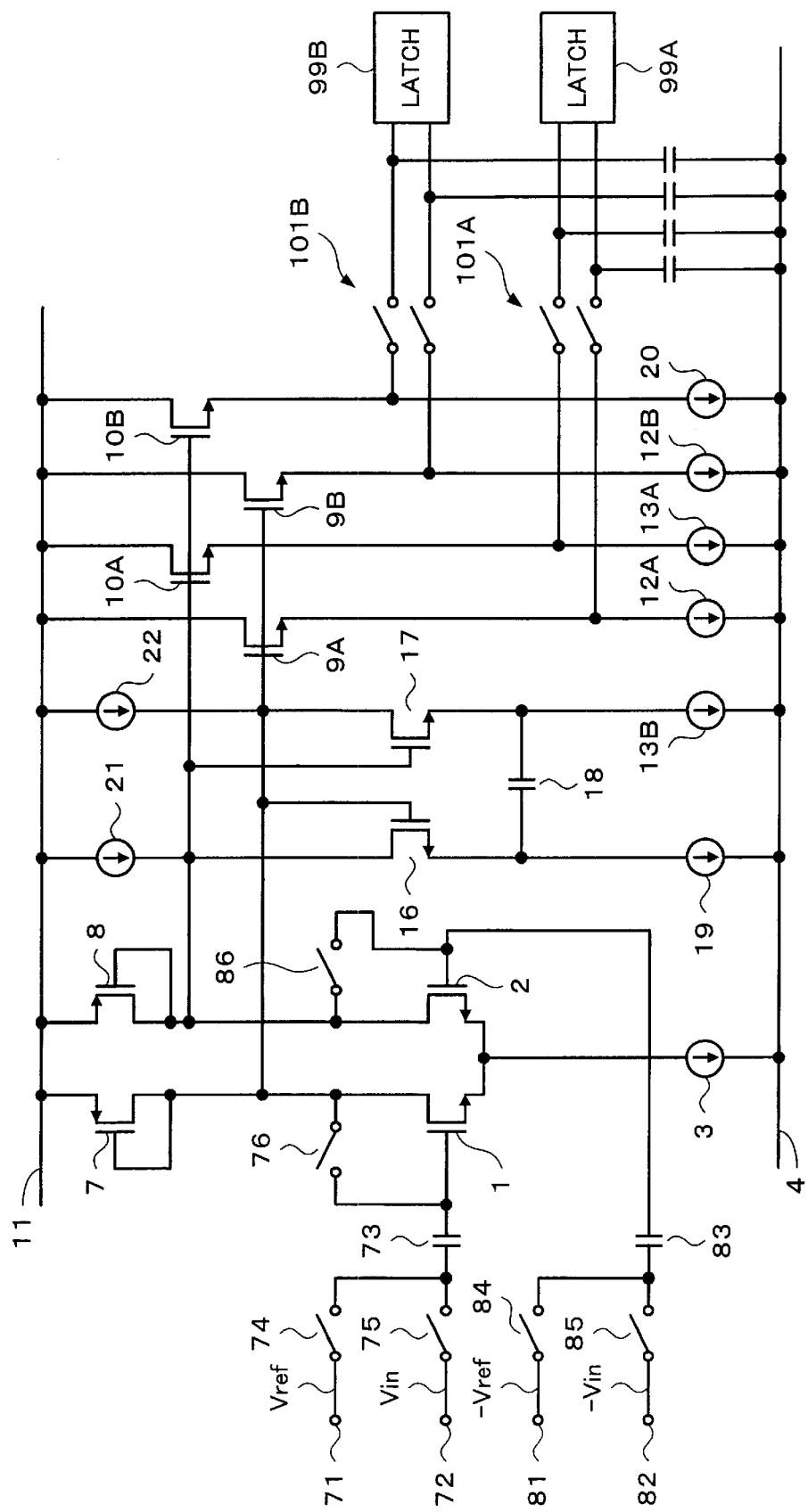
FIG. 15 is a circuit diagram showing another example of the comparator according to the present invention.

To allow an output voltage of the comparator to be processed in parallel, a plurality of (for example, two) source follower circuits may be disposed as shown in FIG. 15. Track hold circuits 101A and 101B may be disposed for the source follower circuits.

In other words, when data is digitized with a sampling clock signal at high speed, high-speed process is required in the next stage.

To do that, as shown in FIG. 15, a plurality of source follower circuits is disposed. The track hold circuits 101A and 101B are disposed for the source follower circuits. A clock signal whose frequency is half of the frequency of the sampling clock signal is supplied to each of the track hold circuits 101A and 101B. The phase of the clock signal supplied to the track hold circuit 101A is reverse of the phase of the clock signal supplied to the track hold circuit 101B. Thus, the circuit in the next stage can operate at ½ speed of the comparator by the interleaving process.

5. Example of Application

The OTA circuit composed of the NMOS transistors 16 and 17, the capacitor 18, and the current sources 19, 20, 21, and 22 is disposed between the differential pair composed of the NMOS transistors 1 and 2 and the NMOS transistors 9 and 10 that compose an output buffer circuit. The OTA circuit generates a compensation current that is the same as a current that flows in the capacitance $C_{GD}$ formed between the gate and the drain of each of the NMOS transistors 1 and 2 and that flows in the reverse direction thereof. The compensation current cancels the current that flows in the capacitance formed between the gate and the drain of each of the transistors 1 and 2. Thus, a CMOS differential amplifier that has a high gain and a wide frequency band and that operates at a low power voltage can be accomplished.

As an example using such a differential amplifier, a comparator and an A/D converter using such a comparator were described. However, such differential amplifiers can be used for various applications. For example, the differential amplifier can be used for a circuit that uses high frequencies such as a satellite broadcast and a wireless LAN.

In the above-described example, the differential amplifier is composed of CMOS transistors. However, it should be noted that the present invention can be applied to a differential amplifier composed of bipolar transistors. In that case, a differential amplifier that has a high gain and a differential amplifier and that operates at a low power voltage can be accomplished.

According to the present invention, an OTA circuit is disposed between a differential pair composed of NMOS transistors and an NMOS follower transistor that composes an output buffer circuit. The OTA circuit generates a compensation current that is equal to a current that flows in a capacitance formed between the gate and the drain of each of the differential pair transistors and that flows in the reverse direction thereof. The compensation current cancels the current that flows in the capacitance formed between the gate and the drain of each of the differential pair transistors. Thus, a differential amplifier that has a high accuracy and, high gain, and a wide frequency band and that operates at a low power voltage can be accomplished.

According to the present invention, using a differential amplifier having a high gain and a wide frequency band, a comparator that operates at high speed and an A/D converter using such a comparator can be accomplished.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A differential amplifier, comprising:
   a differential pair composed of a first transistor and a second transistor whose sources or emitters are connected in common;
   buffer means for extracting an output of said differential pair composed of the first transistor and the second transistor, and
   compensation current generating means for generating a compensation current that is equal to a current that flows in a parasitic capacitance of each of the first transistor and the second transistor, the direction of the compensation current being the reverse of the current that flows in the parasitic capacitance;

wherein said compensating circuit generating means is composed of a voltage input-current output means comprising:
- a third transistor and a fourth transistor, a capacitor equivalent to the parasitic capacitance of each of the first transistor and the second transistor being connected between the sources or the emitters of the third transistor and the fourth transistor;
- a first current source and a second current source connected to the sources or the emitters of the third transistor and the fourth transistor; and
- a third current source and a fourth current source connected to the drains or the collectors of the third transistor and the fourth transistor,
- wherein output voltages of the first transistor and the second transistor are supplied to the gates or the bases of the third transistor and the fourth transistor, and
- wherein output currents of the drains or the collectors of the fourth transistor and the third transistor are supplied as compensation currents to the drains or the collectors of the second transistor and the first transistor.

2. The differential amplifier as set forth in claim 1,
wherein the capacitor equivalent to the parasitic capacitance of each of the first transistor and the second transistor is composed of transistors that are equivalent to the first transistor and the second transistor.

3. A comparator, comprising:

an amplifier;

means for causing the comparator to operate in an auto zero mode and an amp mode, the auto zero mode causing the offset of said amplifier to be canceled, the amp mode causing the input signal to be amplified and output;

means for inputting the input voltage in the auto zero mode and storing the input voltage to a capacitor connected to an input stage of said amplifier;

means for inputting a reference voltage in the amp mode, obtaining the differential voltage between the-input voltage stored in the capacitor connected to the input stage of said amplifier and the reference voltage, and outputting the differential voltage from said amplifier, wherein said amplifier comprises:
- a differential pair composed of a first transistor and a second transistor whose sources or emitters are connected in common;
- buffer means for extracting an output of the differential pair composed of the first transistor and the second transistor, and
- compensation current generating means for generating a compensation current that is equal to a current that flows in a parasitic capacitance of each of the first transistor and the second transistor, the direction of the compensation current being the reverse of the current that flows in the parasitic capacitance;
- wherein the compensating circuit generating means is composed of a voltage input-current output means comprising:
  - a third transistor and a fourth transistor, a capacitor equivalent to the parasitic capacitance of each of the first transistor and the second transistor being connected between the sources or the emitters of the third transistor and the fourth transistor;
  - a first current source and a second current source connected to the sources or the emitters of the third transistor and the fourth transistor; and
  - a third current source and a fourth current source connected to the drains or the collectors of the third transistor and the fourth transistor,
  - wherein output voltages of the first transistor and the second transistor are supplied to the gates or the bases of the third transistor and the fourth transistor, and
  - wherein output currents of the drains or the collectors of the fourth transistor and the third transistor are supplied as compensation currents to the drains or the collectors of the second transistor and the first transistor.

4. The comparator as set forth in claim 3,
wherein the capacitor equivalent to the parasitic capacitance of each of the first transistor and the second transistor is composed of transistors that are equivalent to the first transistor and the second transistor.

5. A comparator, comprising:

an amplifier;

means for causing the comparator to operate in an auto zero mode and an amp mode, the auto zero mode causing the offset of said amplifier to be canceled, the amp mode causing the input signal to be amplified and output;

means for inputting a reference voltage in the auto zero mode and storing the reference voltage to a capacitor connected to an input stage of said amplifier;

means for inputting an input voltage in the amp mode, obtaining the differential voltage between the reference voltage stored in the capacitor connected to the input stage of said amplifier and the input voltage, and outputting the differential voltage from said amplifier, wherein said amplifier comprises:
- a differential pair compose of a first transistor and a second transistor whose sources or emitters are connected in common;
- buffer means for extracting an output of the differential pair composed of the first transistor and the second transistor, and
- compensation current generating means for generating a compensation current that is equal to a current that flows in a parasitic capacitance of each of the first transistor and the second transistor, the direction of the compensation current being the reverse of the current that flows in the parasitic capacitance;
- wherein the compensating circuit generating means is composed of a voltage input-current output means comprising:
  - a third transistor and a fourth transistor, a capacitor equivalent to the parasitic capacitance of each of the first transistor and the second transistor being connected between the sources or the emitters of the third transistor and the fourth transistor;
  - a first current source and a second current source connected to the sources or the emitters of the third transistor and the fourth transistor; and
  - a third current source and a fourth current source connected to the drains or the collectors of the third transistor and the fourth transistor,
  - wherein output voltages of the first transistor and the second transistor are supplied to the gates or the bases of the third transistor and the fourth transistor, and wherein output currents of the drains or the collectors of the fourth transistor and the third transistor are supplied as compensation currents to the drains or the collectors of the second transistor and the first transistor.

6. The comparator as set forth in claim 5,
wherein the capacitor equivalent to the parasitic capacitance of each of the first transistor and the second transistor is composed of transistors that are equivalent to the first transistor and the second transistor.

7. The comparator as set forth in claim 5,
wherein after the comparator is set to the auto zero mode, the comparator is set to the amp mode for several clock pulses so as to cause said amplifier to continuously output the differential voltage between the reference voltage stored in the capacitor connected to the input state of said amplifier and the input voltage.

8. The comparator as set forth in claim 7, further comprising:
holding means for holding an output of said amplifier,
wherein the differential voltage between the reference voltage stored in the capacitor connected to the input stage of said amplifier and the input voltage is held to said holding means, the differential voltage being successively output from said amplifier.

9. The comparator as set forth in claim 8,
wherein a plurality of holding means are disposed, and
wherein the output of said amplifier is held corresponding to each clock pulse supplied to said holding means.

10. An A/D converter, comprising:
reference voltage generating menas for generating a plurality of reference voltages that designate quantizing levels;
a plurality of comparators for comparing each of the reference voltages and an input voltage;
a plurality of latches for latching an output of each of said plurality of comparators;
a decoder for generating a digital value corresponding to the input voltage with the output of each of said plurality of latches,
wherein each of said plurality of comparators comprises:
an amplifier;
means for causing the comparator to operate in an auto zero mode and an amp mode, the auto zero mode causing the offset of the amplifier to be canceled, the amp mode causing the input signal to be amplified and output;
means for inputting the input voltage in the auto zero mode and storing the input voltage to a capacitor connected to an input stage of the amplifier;
means for inputting a reference voltage in the amp mode, obtaining the differential voltage between the input voltage stored in the capacitor connected to the input stage of the amplifier and the reference voltage, and outputting the differential voltage from the amplifier,
wherein the amplifier comprises:
a differential pair composed of a first transistor and a second transistor whose sources or emitters are connected in common;
buffer means for extracting an output of the differential pair composed of the first transistor and the second transistor, and
compensation current generating means for generating a compensation current that is equal to a current that flows in a parasitic capacitance of each of the first transistor and the second transistor, the direction of the compensation current being the reverse of the current that flows in the parasitic capacitance;
wherein the compensating circuit generating means is composed of a voltage input-current output means comprising:
a third transistor and a fourth transistor, a capacitor equivalent to the parasitic capacitance of each of the first transistor and the second transistor being connected between the sources or the emitters of the third transistor and the fourth transistor;
a first current source and a second current source connected to the sources or the emitters of the third transistor and the fourth transistor; and
a third current source and a fourth current source connected to the drains or the collectors of the third transistor and the fourth transistor,
wherein output voltages of the first transistor and the second transistor are supplied to the gates or the bases of the third transistor and the fourth transistor, and
wherein output currents of the drains or the collectors of the fourth transistor and the third transistor are supplied as compensation currents to the drains or the collectors of the second transistor and the first transistor.

11. The A/D converter as set forth in claim 10,
wherein the capacitor equivalent to the parasitic capacitance of each of the first transistor and the second transistor is composed of transistors that are equivalent to the first transistor and the second transistor.

12. An A/D converter, comprising:
reference voltage generating menas for generating a plurality of reference voltages that designate quantizing levels;
a plurality of comparators for comparing each of the reference voltages and an input voltage;
a plurality of latches for latching an output of each of said plurality of comparators;
a decoder for generating a digital value corresponding to the input voltage with the output of each of said plurality of latches,
wherein each of said comparator comprises:
an amplifier;
means for causing the comparator to operate in an auto zero mode and an amp mode, the auto zero mode causing the offset of the amplifier to be canceled, the amp mode causing the input signal to be amplified and output;
means for inputting a reference voltage in the auto zero mode and storing the reference voltage to a capacitor connected to an input stage of the amplifier;
means for inputting an input voltage in the amp mode, obtaining the differential voltage between the reference voltage stored in the capacitor connected to the input stage of the amplifier and the input voltage, and outputting the differential voltage from the amplifier,
wherein the amplifier comprises:
a differential pair composed of a first transistor and a second transistor whose sources or emitters are connected in common;
buffer means for extracting an output of the differential pair composed of the first transistor and the second transistor, and compensation current generating means for generating a compensation current that is equal to a current that flows in a parasitic capacitance of each of the first transistor and the second transistor, the direction of the compensation current being the reverse of the current that flows in the parasitic capacitance;

wherein the compensating circuit generating means is composed of a voltage input-current output means comprising:
- a third transistor and a fourth transistor, a capacitor equivalent to the parasitic capacitance of each of the first transistor and the second transistor being connected between the sources or the emitters of the third transistor and the fourth transistor;
- a first current source and a second current source connected to the sources or the emitters of the third transistor and the fourth transistor; and
- a third current source and a fourth current source connected to the drains or the collectors of the third transistor and the fourth transistor,
- wherein output voltages of the first transistor and the second transistor are supplied to the gates or the bases of the third transistor and the fourth transistor, and
- wherein output currents of the drains or the collectors of the fourth transistor and the third transistor are supplied as compensation currents to the drains or the collectors of the second transistor and the first transistor.

13. The A/D converter as set forth in claim 12,
wherein the capacitor equivalent to the parasitic capacitance of each of the first transistor and the second transistor is composed of transistors that are equivalent to the first transistor and the second transistor.

14. The A/D converter as set forth in claim 12,
wherein after the comparator is set to the auto zero mode, the comparator is set to the amp mode for several clock pulses so as to cause said amplifier to continuously output the differential voltage between the reference voltage stored in the capacitor connected to the input state of said amplifier and the input voltage.

15. The A/D converter as set forth in claim 14, further comprising:
holding means for holding an output of said amplifier,
wherein the differential voltage between the reference voltage stored in the capacitor connected to the input stage of said amplifier and the input voltage is held to said holding means, the differential voltage being successively output from said amplifier.

16. The A/D converter as set forth in claim 15,
wherein a plurality of holding means are disposed, and
wherein the output of said amplifier is held corresponding to each clock pulse supplied to said holding means.

* * * * *

UNITED STATES PATENT AND TRADEMARK OFFICE
CERTIFICATE OF CORRECTION

PATENT NO.      : 6,369,743 B2
DATED           : April 9, 2002
INVENTOR(S)     : Koichi Ono It is certified that error appears in the above-identified patent and that said Letters Patent is hereby corrected as shown below:

<u>Column 19,</u>
Line 31, replace "menas" with -- means --.

<u>Column 20,</u>
Line 36, replace "menas" with -- means --.

Signed and Sealed this

Fourteenth Day of January, 2003

JAMES E. ROGAN
*Director of the United States Patent and Trademark Office*